US011240605B2

(12) United States Patent
Song et al.

(10) Patent No.: US 11,240,605 B2
(45) Date of Patent: Feb. 1, 2022

(54) SOUNDING DEVICE

(71) Applicant: AAC Technologies Pte. Ltd., Singapore (SG)

(72) Inventors: Wei Song, Shenzhen (CN); Fan Zhang, Shenzhen (CN)

(73) Assignee: AAC Technologies Pte. Ltd., Singapore (SG)

(*) Notice: Subject to any disclaimer, the term of this patent is extended or adjusted under 35 U.S.C. 154(b) by 0 days.

(21) Appl. No.: 16/992,132

(22) Filed: Aug. 13, 2020

(65) Prior Publication Data
US 2020/0413199 A1    Dec. 31, 2020

Related U.S. Application Data

(63) Continuation of application No. PCT/CN2019/093968, filed on Jun. 29, 2019.

(51) Int. Cl.
*H04R 9/02* (2006.01)
*H04R 9/06* (2006.01)
*H05K 1/18* (2006.01)
*H04R 1/28* (2006.01)

(52) U.S. Cl.
CPC ........... *H04R 9/025* (2013.01); *H04R 1/2834* (2013.01); *H04R 9/06* (2013.01); *H05K 1/189* (2013.01); *H04R 2400/03* (2013.01)

(58) Field of Classification Search
CPC combination set(s) only.
See application file for complete search history.

(56) References Cited

U.S. PATENT DOCUMENTS

| 9,294,845 | B2* | 3/2016 | Cai | H04R 9/06 |
| 9,426,594 | B2* | 8/2016 | Cai | H04R 9/06 |
| 9,813,821 | B1* | 11/2017 | Song | H04R 9/025 |
| 9,936,302 | B2* | 4/2018 | Linghu | H04R 7/18 |
| 10,250,989 | B1* | 4/2019 | Xiao | H04R 31/003 |
| 11,026,025 | B2* | 6/2021 | Xiao | H04R 9/041 |
| 2013/0259289 | A1* | 10/2013 | Zhang | H04R 9/025 381/412 |
| 2016/0112804 | A1* | 4/2016 | Xiao | H04R 9/025 381/398 |
| 2017/0339478 | A1* | 11/2017 | Xiao | H04R 9/025 |

(Continued)

FOREIGN PATENT DOCUMENTS

CN    107277706 A  * 10/2017

*Primary Examiner* — Angelica M McKinney
(74) *Attorney, Agent, or Firm* — W&G Law Group

(57) ABSTRACT

A sounding device includes a frame, a vibration system and a magnetic circuit system with a magnetic gap. The vibration system includes a diaphragm and a voice coil inserted in the magnetic gap. The coil includes two first sides and two second sides. An elastic supporting member including an auxiliary diaphragm is fixed to the frame and spaced from the second sides. The magnetic circuit system includes a yoke, a main magnet fixed to the yoke, and a first auxiliary magnet and a second auxiliary magnet fixed to the yoke and spaced from the main magnet to form the magnetic gap. The second auxiliary magnet is spaced from the first side. An end portion of the second auxiliary magnet close to the auxiliary diaphragm is recessed to form an avoidance notch, and the auxiliary diaphragm extends along the first sides to form an extending portion located in the avoidance notch.

12 Claims, 10 Drawing Sheets

(56) References Cited

U.S. PATENT DOCUMENTS

| | | | |
|---|---|---|---|
| 2017/0347204 A1* | 11/2017 | Linghu | H04R 7/14 |
| 2018/0302722 A1* | 10/2018 | Linghu | H04R 7/18 |
| 2018/0302723 A1* | 10/2018 | Xiao | H04R 9/06 |
| 2019/0104369 A1* | 4/2019 | Kim | H04R 31/006 |
| 2019/0238989 A1* | 8/2019 | Xiao | H04R 9/025 |
| 2020/0045460 A1* | 2/2020 | Xiao | H04R 1/02 |
| 2020/0045466 A1* | 2/2020 | Song | H04R 9/043 |
| 2020/0053476 A1* | 2/2020 | Xiao | H05K 1/0277 |
| 2020/0137500 A1* | 4/2020 | Moenke | H04R 9/043 |

\* cited by examiner

SOUNDING DEVICE

FIELD OF THE DISCLOSURE

The present disclosure relates to the field of electro-acoustic transducers, and in particular to a sounding device.

BACKGROUND OF THE DISCLOSURE

With the advent of the mobile internet era, the number of smart mobile devices has been continuously increasing. Among various mobile devices, mobile phones are undoubtedly the most common and portable mobile terminal devices. At present, functions of the mobile phones are extremely diverse, one of which is a high-quality music function. Therefore, a sounding device for playing sound is widely applied to current smart mobile devices.

The sounding device in the related art includes a frame, a vibration system mounted to the frame, and a magnetic circuit system with a magnetic gap. The vibration system includes a diaphragm mounted to the frame and a voice coil inserted in the magnetic gap for driving the diaphragm to vibrate and sound. The voice coil includes a pair of first sides and a pair of second sides connected between the first sides, the first sides and the second sides cooperatively form a ring, and the second sides are provided with an elastic supporting member which is connected to the voice coil and fixed to the frame. The elastic supporting member is spaced from the second sides to form a receiving space. The elastic supporting member includes an auxiliary diaphragm. The magnetic circuit system includes a yoke held to the frame, a main magnet fixed to the yoke, and a first auxiliary magnet and a second auxiliary magnet fixed to the yoke and spaced from the main magnet to form the magnetic gap. The first auxiliary magnet is spaced from the second sides and located in the receiving space, and the second auxiliary magnet is spaced from the first side.

However, the auxiliary diaphragm in the related art and the second auxiliary magnet do not overlap in space. If the second auxiliary magnet is lengthened, the performance is enhanced. However, when the second auxiliary magnet is lengthened the auxiliary diaphragm will be reduced, and the swing of the product is intensified. On the contrary, if the auxiliary diaphragm is lengthened, the swing of the product will be reduced. However, when the auxiliary diaphragm is lengthened, the second auxiliary magnet will be shortened and the performance is thus decreased.

Therefore, it is necessary to provide an improved sounding device to solve the above problems.

SUMMARY OF THE DISCLOSURE

An object of the present disclosure is to provide a sounding device with an enlarged auxiliary diaphragm while the performance of the sounding device is basically unchanged.

The present disclosure provides a sounding device which comprises a frame, a vibration system mounted to the frame, a magnetic circuit system comprising a yoke attached to the frame, a main magnet fixed to the yoke, and a first auxiliary magnet and a second auxiliary magnet fixed to the yoke and spaced from the main magnet to form a magnetic gap therebetween; and an elastic supporting member fixed to the frame. The vibration system comprises a diaphragm mounted to the frame and a voice coil inserted in the magnetic gap for driving the diaphragm to vibrate and sound. The voice coil comprises a pair of first sides and a pair of second sides connected between the first sides. The elastic supporting member is connected to the voice coil and spaced from the second sides of the voice coil to form a receiving space. The elastic supporting member comprises an auxiliary diaphragm. The first auxiliary magnet is located in the receiving space and spaced from the second side, and the second auxiliary magnet is spaced from the first side. An end portion of the second auxiliary magnet close to the auxiliary diaphragm is recessed to form an avoidance notch, the avoidance notch is located at a side of the second auxiliary magnet away from the main magnet, and the auxiliary diaphragm extends along the first sides to form an extending portion located in the avoidance notch.

In some embodiments, the auxiliary diaphragm comprises a first fixing portion fixed to the frame, a second fixing portion connected to the voice coil, and a rim portion connecting the first fixing portion and the second fixing portion.

In some embodiments, the extending portion comprises a first part extending along the first side from the first fixing portion and a second part extending along the first side from the rim portion, and the first part is connected to the second part.

In some embodiments, the first fixing portion is fixed to the frame.

In some embodiments, the rim portion is provided with a slot recessed from a side close to the voice coil in a direction away from the voice coil, and the first auxiliary magnet extends into the slot.

In some embodiments, the vibration system further comprises a connecting framework, the voice coil is connected to the diaphragm and the elastic supporting member respectively through the connecting framework.

In some embodiments, the elastic supporting member further comprises an elastic member which comprises a first fixing wall fixed to the first fixing portion, a second fixing wall fixed to the second fixing portion, and an elastic arm connecting the first fixing wall and the second fixing wall, an opening of the rim portion faces the elastic arm, and an orthographic projection of the elastic arm on the auxiliary diaphragm in a vibration direction of the diaphragm falls within the boundary of the rim portion.

In some embodiments, the second fixing wall extends into the avoidance notch, and the extending portion is connected to the second fixing wall.

In some embodiments, the elastic member is a flexible circuit board which is electrically connected to the voice coil.

In some embodiments, the magnetic circuit system further comprises a fixing plate, the elastic member is sandwiched between the auxiliary diaphragm and the fixing plate.

In some embodiments, the fixing plate comprises an annular fixing ring fixed to the frame, a first auxiliary pole core fixed to the fixing ring and stacked on the second auxiliary magnet, and a second auxiliary pole core fixed to the fixing ring through a connecting portion and stacked on the first auxiliary magnet.

In some embodiments, the first fixing wall is fixed to the fixing ring, and a space for receiving the elastic arm is formed between the fixing ring, the first auxiliary pole core, and the second auxiliary pole core.

Compared with the related art, the sounding device of the present disclosure is provided with an avoidance notch in the second auxiliary magnet, so that the auxiliary diaphragm extends along the first side to form an extending portion located in the avoidance notch, thereby increasing the size of auxiliary diaphragm and reducing the swing of the product while the performance is basically unchanged.

BRIEF DESCRIPTION OF THE DRAWINGS

In order to explain the technical solutions of the embodiments of the present disclosure more clearly, accompanying drawings used to describe the embodiments are briefly introduced below. It is evident that the drawings in the following description are only concerned with some embodiments of the present disclosure. For those skilled in the art, in a case where no inventive effort is made, other drawings may be obtained based on these drawings.

DETAILED DESCRIPTION OF THE PREFERRED EMBODIMENTS

Figure 1:
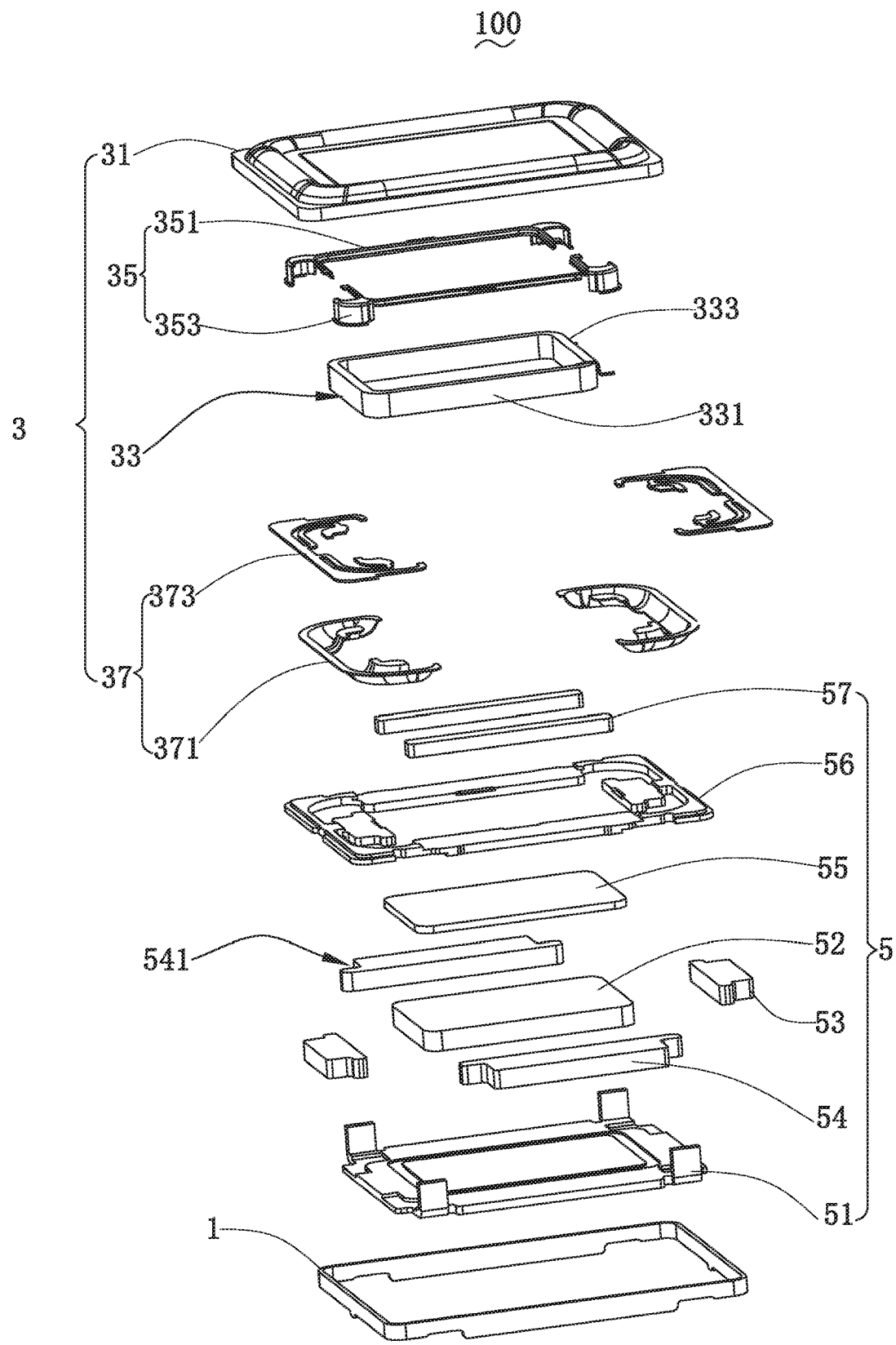
FIG. 1 is an exploded view of a sounding device in accordance with an exemplary embodiment of the present disclosure.

The present disclosure will be further described below with reference to the drawings and embodiments.

Referring to FIG. 1 to FIG. 10, a sounding device 100 includes a frame 1, a vibration system 3 mounted to the frame 1, and a magnetic circuit system 5 having a magnetic gap.

The vibration system 3 includes a diaphragm 31 mounted to the frame 1, a voice coil 33 inserted in the magnetic gap for driving the diaphragm 31 to vibrate and sound, a connecting framework 35, and an elastic supporting member 37. The voice coil 33 is connected to the diaphragm 31 and the elastic supporting member 37 respectively through the connecting framework 35. After the voice coil 33 is energized, the voice coil 33 vibrates under the action of the magnetic circuit system 5, and the diaphragm 31, the connecting framework 35, and the elastic supporting member 37 vibrate together with the voice coil 33 in a vibration direction which is parallel to the axis of the voice coil 33.

The diaphragm 31 and the voice coil 33 as well as the voice coil 33 and the elastic supporting member 37 are not directly connected to each other. Instead, the diaphragm 31, the voice coil 33, and the elastic supporting member 37 are connected together through the connecting framework 35, which, on the one hand, can reduce and inhibit the swing of the voice coil 33 and improve the reliability and stability of the sounding device; on the other hand, can remove the restriction on the structural design of the voice coil 33, so that the position of the voice coil 33 can float up and down along the vibration direction. The voice coil 33 is indirectly connected to the elastic supporting member 37, so that the designed height of the voice coil 33 is not affected by the elastic supporting member 37, thus making the sounding device designed to be thinner and lighter. The voice coil 33 is indirectly connected to the elastic supporting member 37, so that interference between the magnetic circuit system 5 and the elastic supporting member 37 is effectively avoided. The magnetic circuit system 5 does not need to give an access to the elastic supporting member 37, thus maximizing the magnetic circuit system 5 and effectively improving the acoustic performance of the sounding device.

The voice coil 33 includes a pair of first sides 331 and a pair of second sides 333 connected between the first sides 331. The first sides 331 and the second sides 333 cooperatively form a ring. The second sides 333 are provided with the elastic supporting member 37 which is connected to the voice coil 33 through the connecting framework 35 and secured to the frame 1. The elastic supporting member 37 is spaced from the second sides 333 of the voice coil 33 to form a receiving space 1A (see FIG. 10) therebetween.

As shown in FIG. 1, the connecting framework 35 includes two framework bodies 351 and two framework connecting portions 353 extending from opposite ends of each framework body 351 respectively. The two framework bodies 351 face to each other and cooperatively form a ring structure. Two opposite side surfaces of the framework bodies 351 along the vibration direction are connected to the diaphragm 31 and the voice coil 33 respectively. The framework connecting portions 353 are located at rounded corners of the framework bodies 351. The connecting framework 35 comprises multiple framework connecting portions 353, which may avoid interference with the magnetic circuit system 5 to a large extent, so that the magnetic circuit system 5 can utilize more sufficient space to improve the vibration performance.

Figure 6:
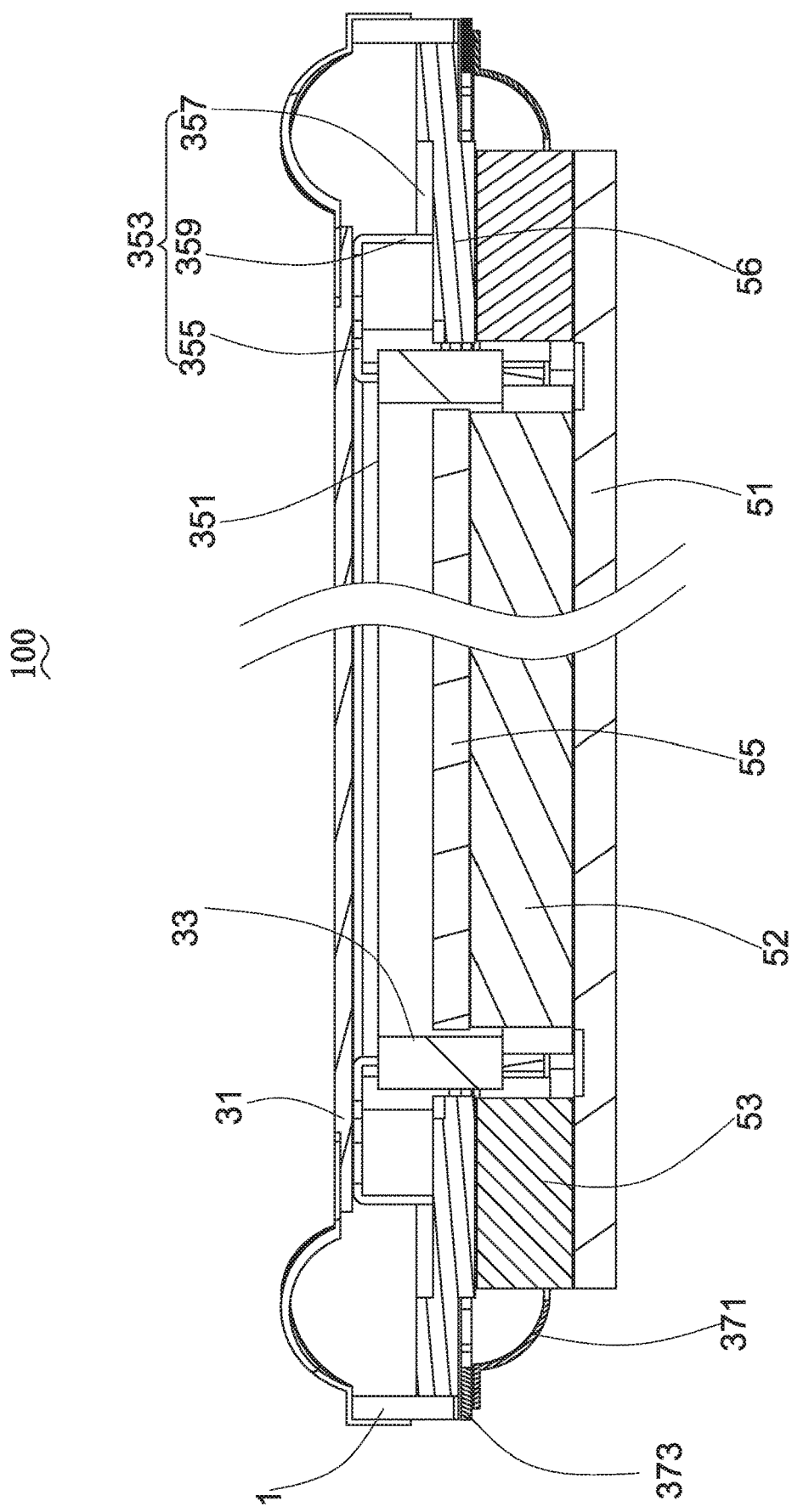
FIG. 6 is a cross-sectional view of the sounding device shown in FIG. 4, taken along line B-B.
Figure 7:
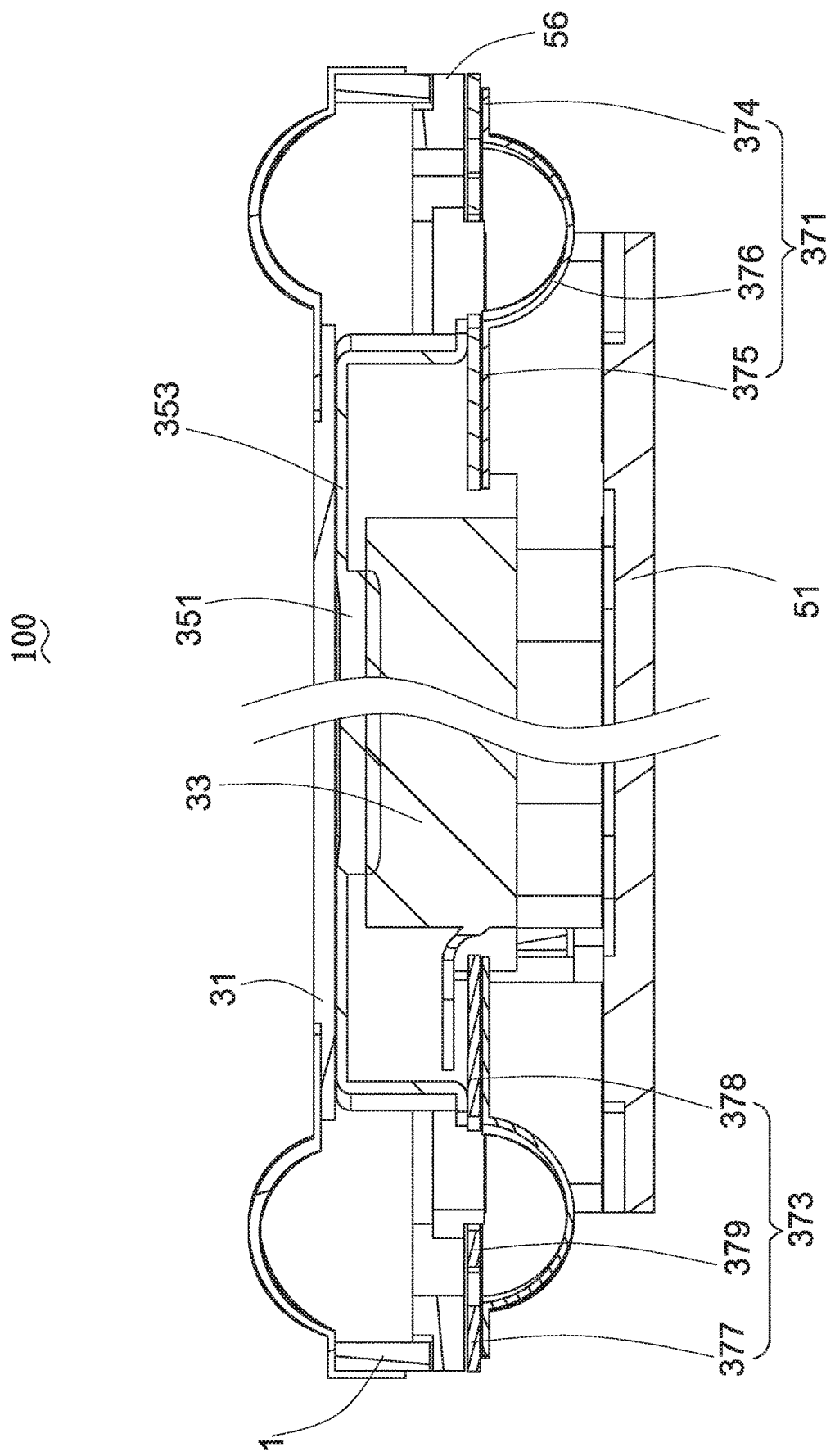
FIG. 7 is a cross-sectional view of the sounding device shown in FIG. 4, taken along line C-C.

Referring to FIG. 6, the framework connecting portions 353 includes a top wall 355 connected to the diaphragm 31, a bottom wall 357 connected to the elastic supporting member 37, and a side wall 359 connected to the top wall 355 and the bottom wall 357. Thus, the elastic supporting member 37 can support the voice coil 33 and is spaced from the voice coil 33, so that the voice coil 33 is not limited by the elastic supporting member 37 when vibrating.

The elastic supporting member 37 includes an auxiliary diaphragm 371 and an elastic member 373 connected to the auxiliary diaphragm 371, which is capable of more effectively inhibiting the swing of the voice coil. In this embodiment, the elastic member 373 may be a flexible circuit board electrically connected to the voice coil 33. The voice coil 33 is electrically connected to an external circuit through the flexible circuit board. The elastic member 373 may also be a damper. Preferably, the elastic member 373 is a flexible circuit board.

Figure 8:
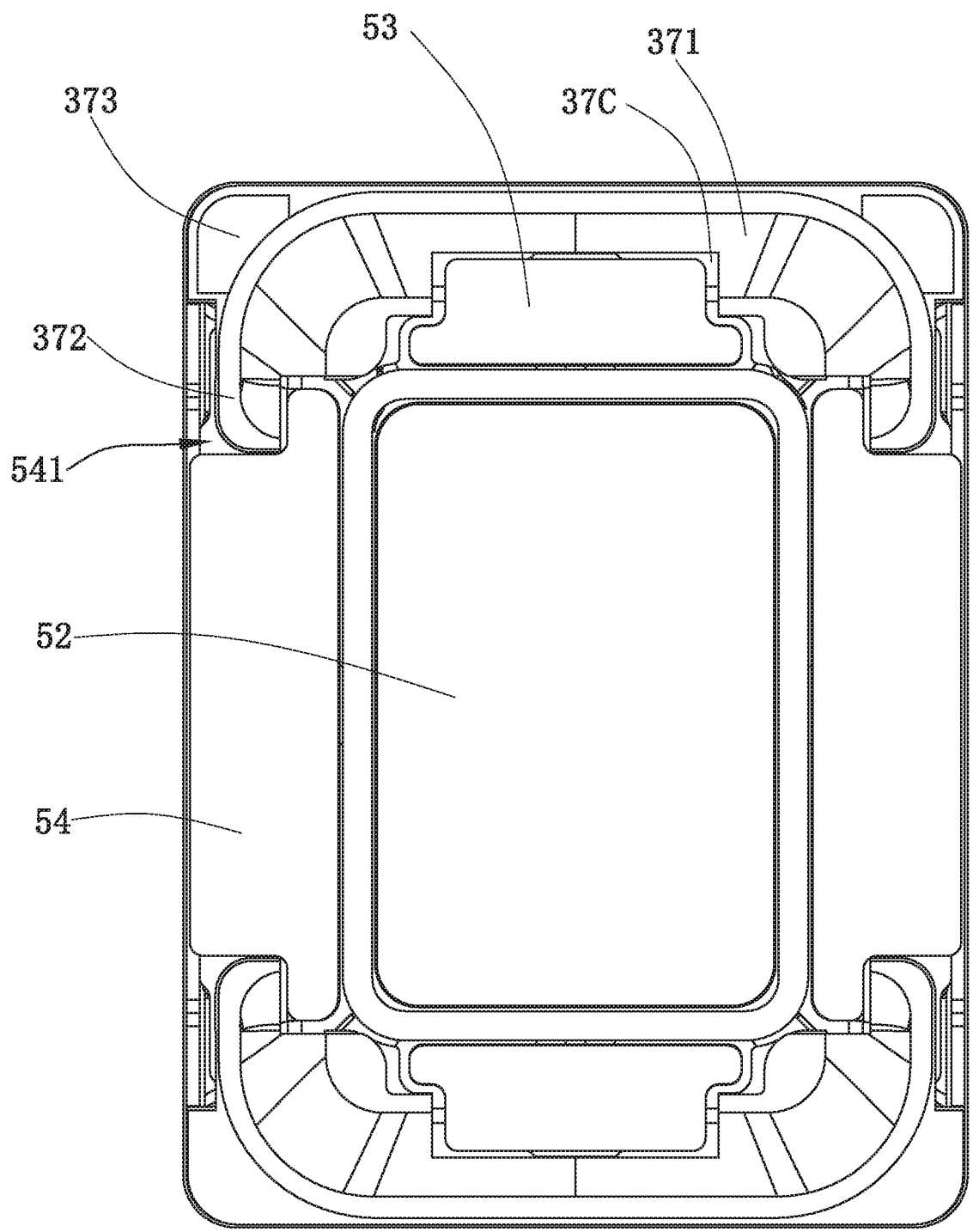
FIG. 8 is a schematic structural view of the sounding device shown in FIG. 4 with a yoke removed, viewed from another aspect.
Figure 9:
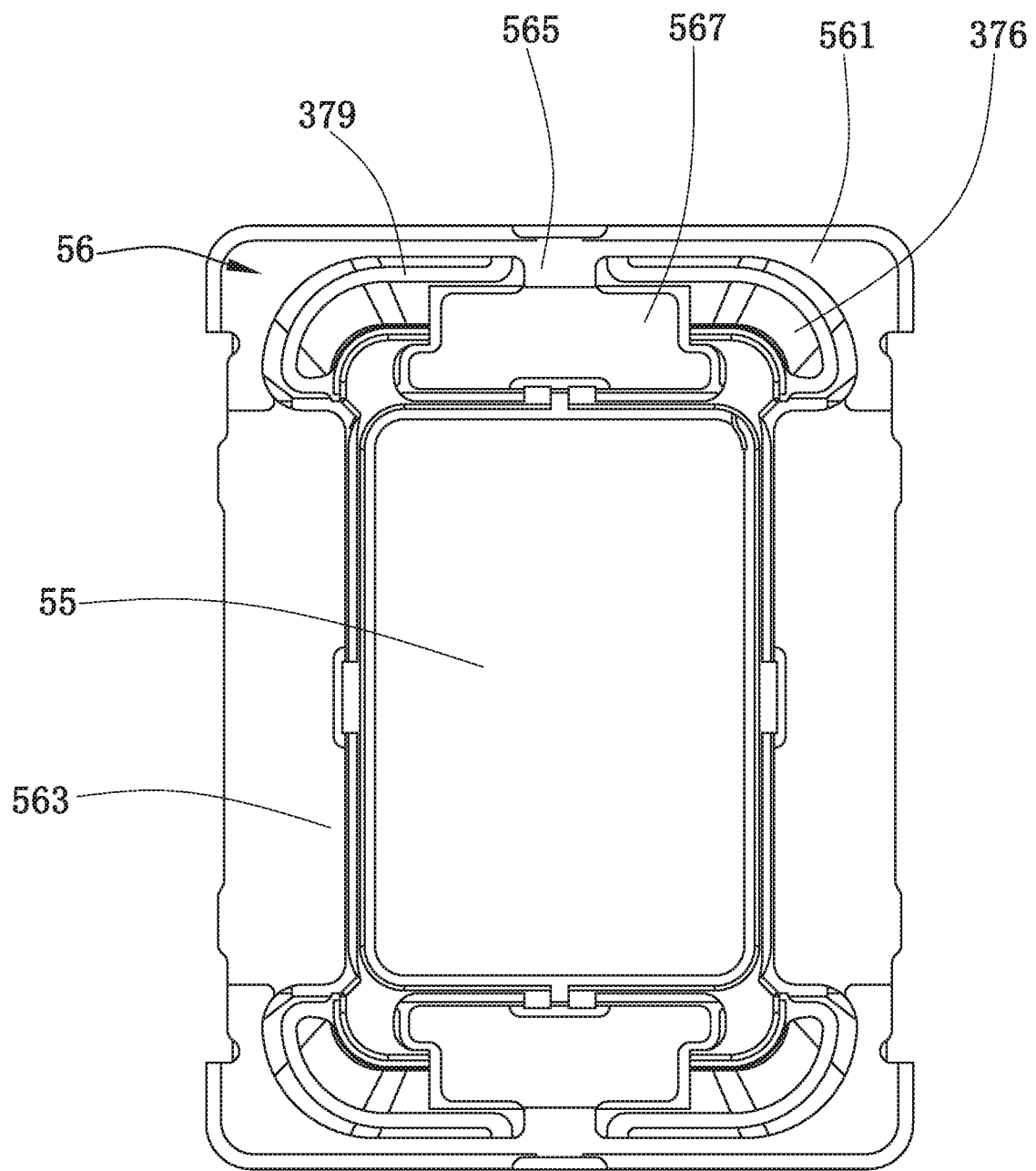
FIG. 9 is an assembled view of a fixing plate, an elastic member, an auxiliary diaphragm, and a main pole core in the sounding device shown in FIG. 1.
Figure 10:
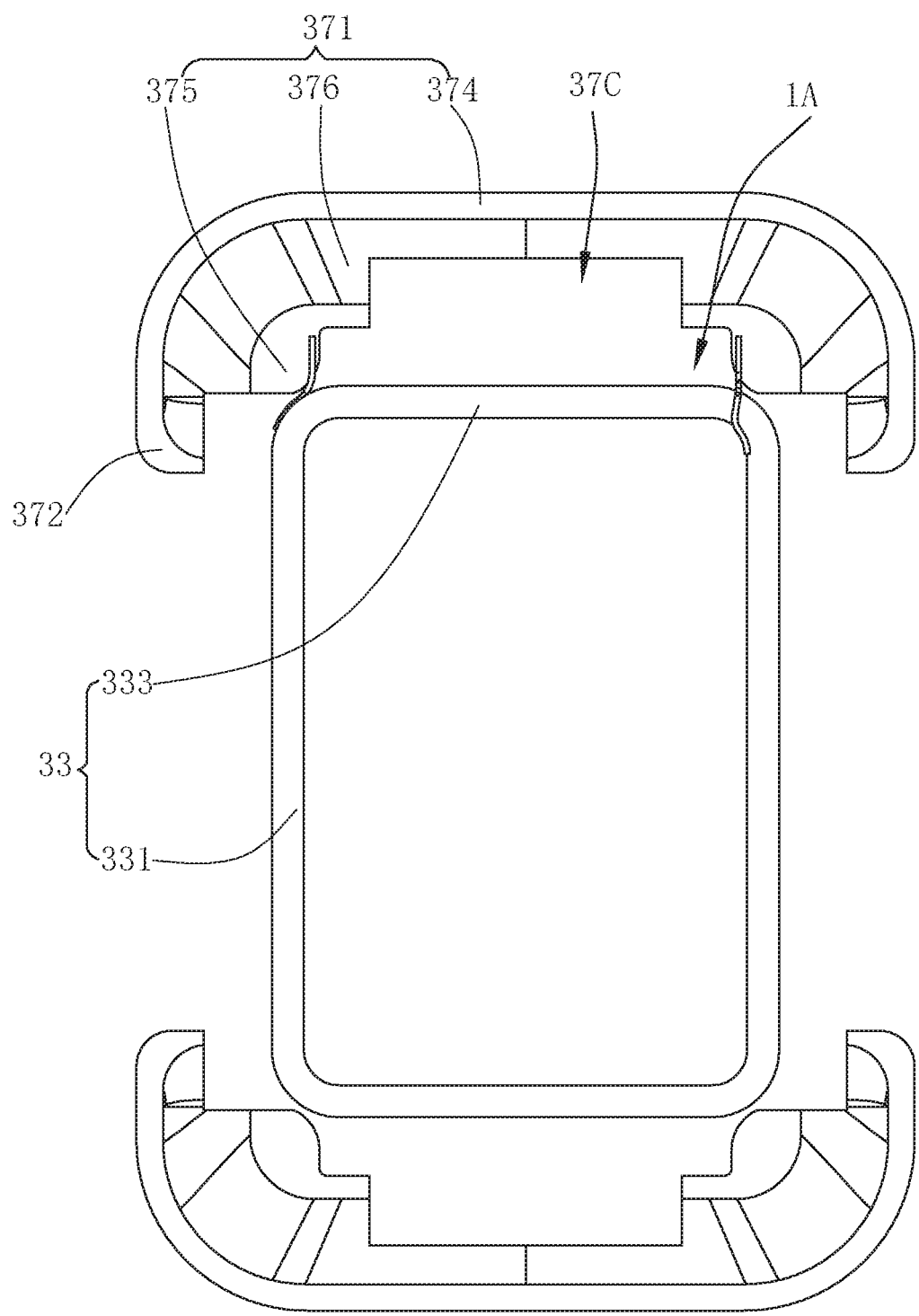
FIG. 10 is an assembled view of an auxiliary diaphragm and a voice coil in the sounding device shown in FIG. 1.

As shown in FIG. 8, an end portion of a second auxiliary magnet 54 in the magnetic circuit system 5 to be described later close to the auxiliary diaphragm 371 is recessed to form an avoidance notch 541. The avoidance notch 541 is located on a side of the second auxiliary magnet 54 away from the main magnet 52 in the magnetic circuit system 5 to be described later. The auxiliary diaphragm 371 extends along the first sides 331 of the voice coil 33 to form an extending portion 372 located in the avoidance notch 541.

The auxiliary diaphragm 371 includes a first fixing portion 374, a second fixing portion 375, and a rim portion 376 connecting the first fixing portion 374 and the second fixing portion 375. The rim portion 376 is curved with an opening.

Figure 2:
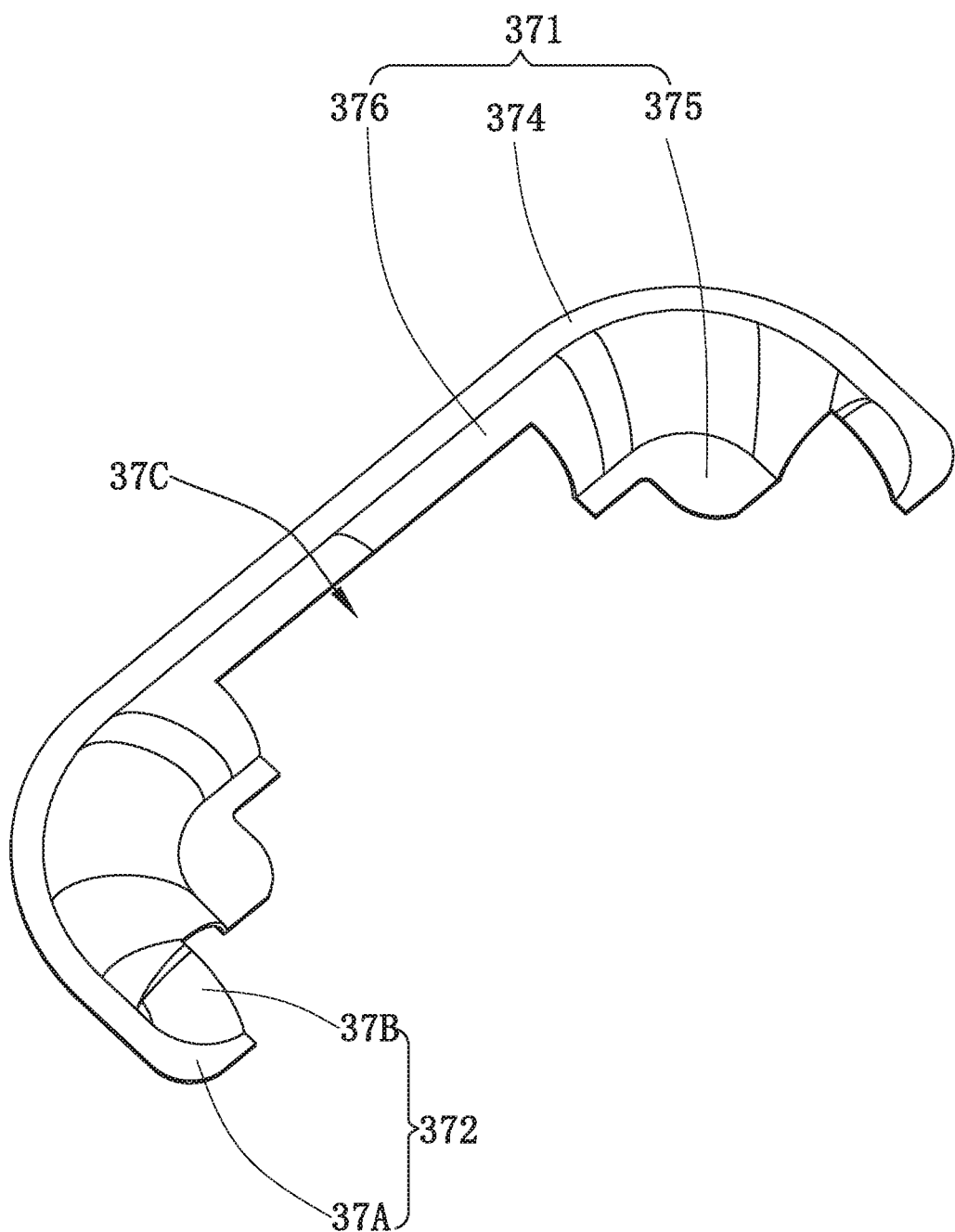
FIG. 2 is a schematic structural view of an auxiliary diaphragm of the sounding device shown in FIG. 1.

As shown in FIG. 2, the extending portion 372 includes a first part 37A extending along the first sides 331 of the voice coil 33 from the first fixing portion 374 and a second part 37B extending along the first sides 331 of the voice coil 33 from the rim portion 376. The first part 37A is connected to the second part 37B. It can be understood that, in other embodiments, the extending portion may have only the first part without the second part.

As shown in FIG. 2, the rim portion 376 defines a slot 37C recessed from a side thereof close to the voice coil 33 in a direction away from the voice coil 33. A first auxiliary magnet 53 in the magnetic circuit system 5 to be described later extends into the slot 37C.

Figure 3:
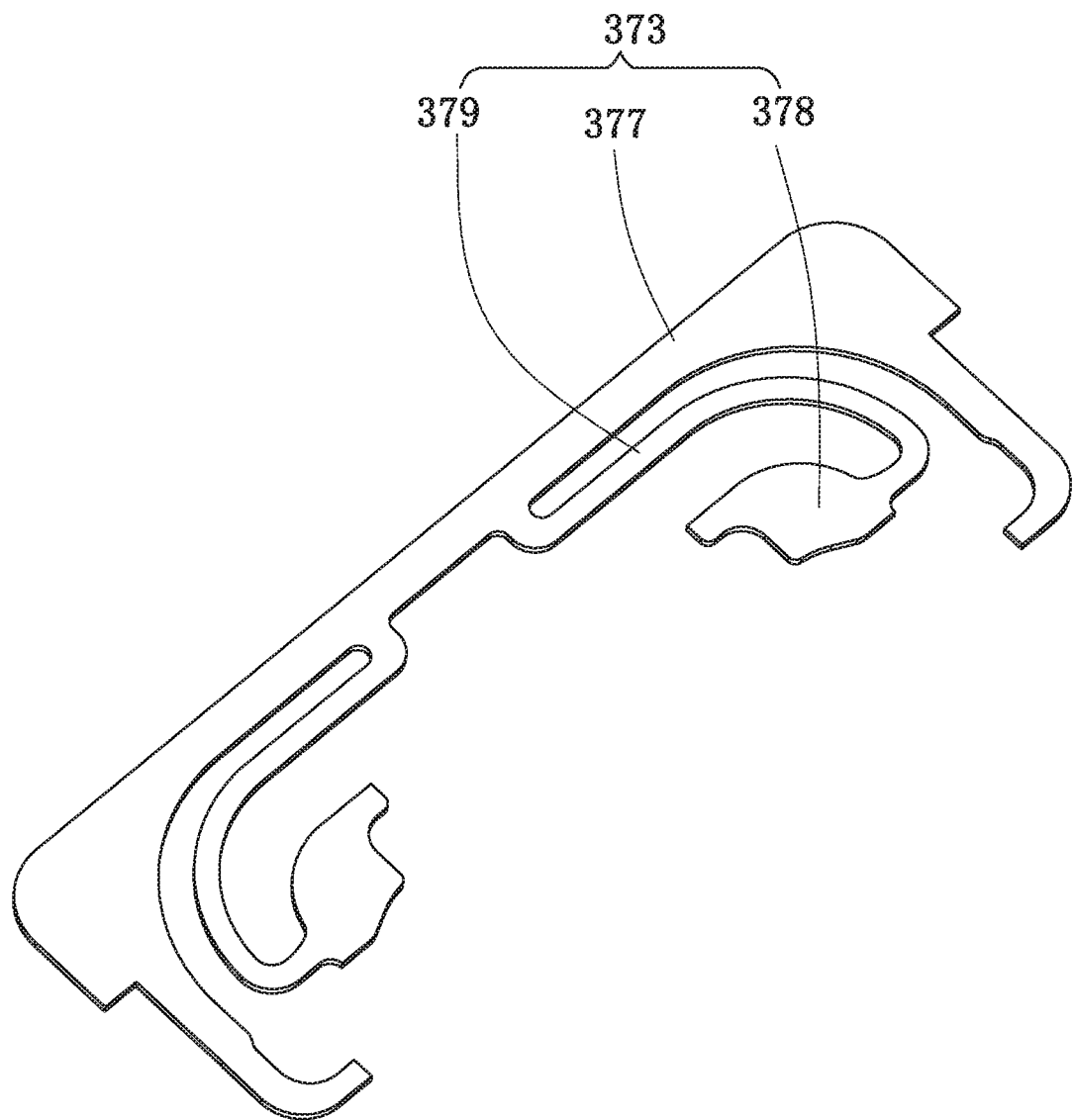
FIG. 3 is a schematic structural view of an elastic member of the sounding device shown in FIG. 1.
Figure 4:
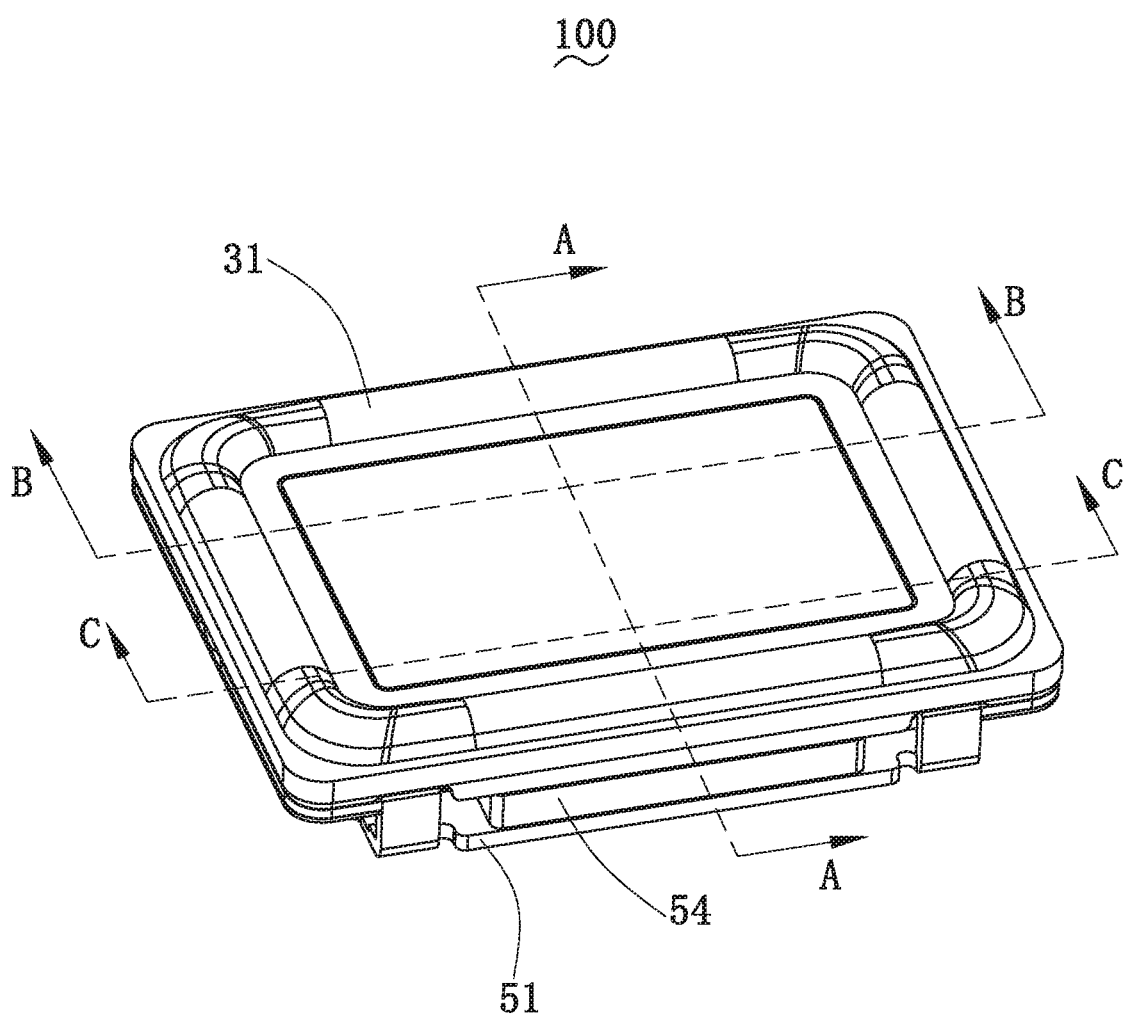
FIG. 4 is an assembled view of the sounding device shown in FIG. 1.

As shown in FIG. 3, the elastic member 373 includes a first fixing wall 377 fixed to the first fixing portion 374, a second fixing wall 378 fixed to the second fixing portion 375, and an elastic arm 379 connecting the first fixing wall 377 and the second fixing wall 378. The opening of the rim portion 376 faces the elastic arm 379, and an orthographic projection of the elastic arm 379 on the auxiliary diaphragm 371 in the vibration direction falls within the boundary of the rim portion 376.

In this embodiment, the second fixing wall 378 extends into the avoidance notch 541 in the second auxiliary magnet 54 to be described later, and the extending portion 372 is connected to the second fixing wall 378. Specifically, the second part 37B of the extending portion 372 is connected to the second fixing wall 378.

Figure 5:
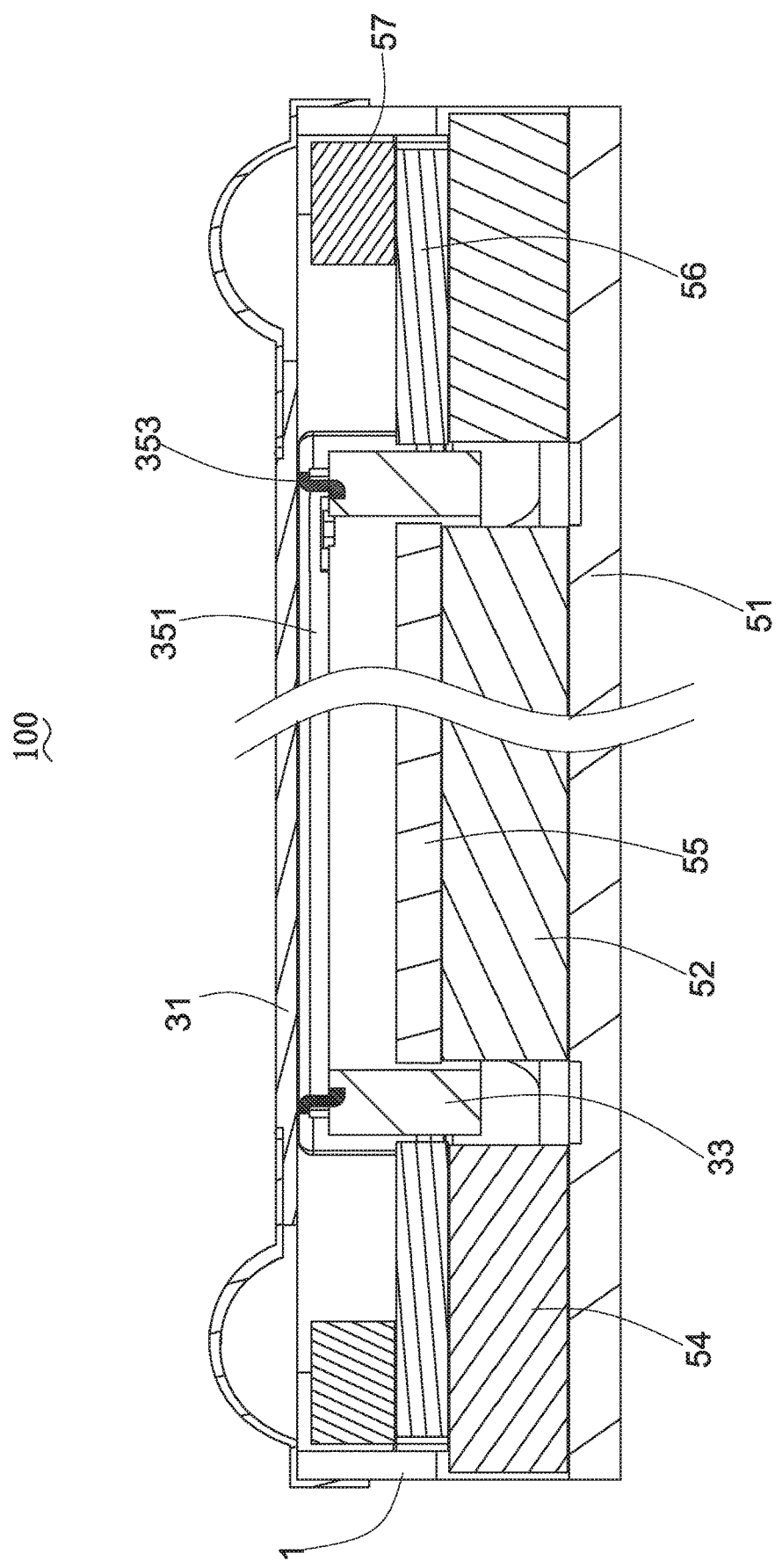
FIG. 5 is a cross-sectional view of the sounding device shown in FIG. 4, taken along line A-A.

As shown in FIG. 1, the magnetic circuit system 5 includes a yoke 51 fixed to the frame 1, a main magnet 52 fixed to the yoke 51, a first auxiliary magnet 53 and a second auxiliary magnet 54 fixed to the yoke 51 and spaced from the main magnet 52 to form the magnetic gap, a main pole core 55 stacked on the main magnet 52, and a fixing plate 56 fixed to the frame 1 and stacked on the first auxiliary magnet 53 and the second auxiliary magnet 54. As shown in FIG. 5 and FIG. 6, after the sounding device is assembled, the main pole core 55 and the fixing plate 56 are located in the same plane. The magnetic circuit system 5 further includes a third auxiliary magnet 57 stacked on the fixing plate 56, and the third auxiliary magnet 57 is spaced from the second auxiliary magnet 54 along the vibration direction of the diaphragm 31.

The first auxiliary magnet 53 is spaced from the second sides 333 of the voice col 33 and located in the receiving space 1A formed between the elastic supporting member 37 and the voice coil 33. As shown in FIG. 8, the first auxiliary magnet 53 extends into the slot 37C of the rim portion 376.

The second auxiliary magnet 54 is spaced from the first sides 331 of the voice coil 33, an end portion of the second auxiliary magnet 54 close to the auxiliary diaphragm 371 is recessed inwardly to form an avoidance notch 541, the avoidance notch 541 is located on a side of the second auxiliary magnet 54 away from the main magnet 52, and the extending portion 372 of the auxiliary diaphragm 371 is received in the avoidance notch 541.

The elastic member 373 is sandwiched between the auxiliary diaphragm 371 and the fixing plate 56. That is to say, the auxiliary diaphragm 371 is indirectly fixed to the frame 1 through the elastic member 373 and the fixing plate 56, and the auxiliary diaphragm 371 is indirectly connected to the voice coil 33 through the elastic member 373 and the connecting framework 35. Specifically, the first fixing portion 374 of the auxiliary diaphragm 371 is indirectly fixed to the frame 1 through the first fixing wall 377 of the elastic member 373 and a fixing ring 561 of the fixing plate 56 to be described later; and the second fixing portion 375 of the auxiliary diaphragm 371 is indirectly connected to the voice coil 33 through the second fixing wall 378 of the elastic member 373 and the connecting framework 35.

The fixing plate 56 includes an annular fixing ring 561 fixed to the frame 1, a first auxiliary pole core 563 fixed to the fixing ring 561 and stacked on the second auxiliary magnet 54, and a second auxiliary pole core 567 fixed to the fixing ring 561 through the connecting portion 565 and stacked on the first auxiliary magnet 53. The first fixing wall 377 is fixed to the fixing ring 561, and a space for receiving the elastic arm 379 is formed between the fixing ring 561, the first auxiliary pole core 563, and the second auxiliary pole core 567.

The connecting framework is described in the above embodiment, but is not limited thereto. In other embodiments, the framework main bodies may also be designed to a continuous ring structure. The diaphragm and the voice coil may also be connected through one of the framework main body and the framework connecting portion, and the framework connecting portion and the framework main body may also be fixed by welding, for example, the framework connecting portion and the framework body both being made of metal.

In the above embodiment, the elastic supporting member includes an auxiliary diaphragm and an elastic member, but the elastic supporting member is not limited thereto. In other embodiments, the elastic supporting member may not include the elastic member. Correspondingly, the first fixing portion of the auxiliary diaphragm is indirectly fixed to the frame through the fixing ring of the fixing plate, and the second fixing portion of the auxiliary diaphragm is directly fixed to a bottom wall of the framework connecting portion.

In the above embodiment, the diaphragm, the voice coil, and the elastic supporting member are connected together through the connecting framework, but they are not limited thereto. In other embodiment, the diaphragm and the voice coil may be directly connected, the voice coil and the elastic supporting member may be directly glued, and correspondingly, the elastic member is directly connected to a side of the voice coil away from the diaphragm.

Compared with the related art, the sounding device of the present disclosure is provided with an avoidance notch 541 in the second auxiliary magnet 54, so that the auxiliary diaphragm 371 extends along the first side 331 to form an extending portion 372 located in the avoidance notch 541, thereby increasing the size of auxiliary diaphragm and reducing the swing of the product while the performance is basically unchanged.

The above are only embodiments of the present disclosure. It should be noted that those of ordinary skill in the art can make improvements without departing from the inventive concept of the present disclosure, but these improvements should be within the protection scope of the present disclosure.

The invention claimed is:
1. A sounding device, comprising:
a frame;
a vibration system mounted to the frame;
a magnetic circuit system comprising a yoke attached to the frame, a main magnet fixed to the yoke, and a pair of first auxiliary magnets and a pair of second auxiliary magnets fixed to the yoke and spaced from the main magnet to form a magnetic gap therebetween; and
an elastic supporting member fixed to the frame;
wherein the vibration system comprises a diaphragm mounted to the frame and a voice coil inserted in the magnetic gap for driving the diaphragm to vibrate and sound, the voice coil comprising a pair of first sides and a pair of second sides connected between the first sides;

wherein the elastic supporting member is connected to the voice coil and spaced from the second sides of the voice coil to form two receiving spaces which are arranged opposite to each other, the elastic supporting member comprising an auxiliary diaphragm, wherein each of the first auxiliary magnets are located in each of the two receiving spaces respectively and spaced from the second sides, and each of the second auxiliary magnets are spaced from the first sides; and wherein both end portions of the second auxiliary magnets close to the auxiliary diaphragm are recessed inwardly to form a plurality of avoidance notches, the plurality of avoidance notches are located at a side of the second auxiliary magnets away from the main magnet, and the auxiliary diaphragm extends along the first sides to form a plurality of extending portions located in the plurality of avoidance notches, respectively.

2. The sounding device according to claim 1, wherein the auxiliary diaphragm comprises a first fixing portion fixed to the frame, a second fixing portion connected to the voice coil, and a rim portion connecting the first fixing portion and the second fixing portion.

3. The sounding device according to claim 2, wherein each of the extending portions comprises a first part extending along the first sides of the voice coil from the first fixing portion and a second part extending along the first sides of the voice coil from the rim portion, and the first part is connected to the second part.

4. The sounding device according to claim 3, wherein the first fixing portion is fixed to the frame.

5. The sounding device according to claim 2, wherein the rim portion is provided with a slot recessed from a side close to the voice coil in a direction away from the voice coil, and at least one of the pair of first auxiliary magnets extends into the slot.

6. The sounding device according to claim 2, wherein the vibration system further comprises a connecting framework, the voice coil is connected to the diaphragm and the elastic supporting member respectively through the connecting framework.

7. The sounding device according to claim 2, wherein the elastic supporting member further comprises an elastic member which comprises a first fixing wall fixed to the first fixing portion, a second fixing wall fixed to the second fixing portion, and an elastic arm connecting the first fixing wall and the second fixing wall, an opening of the rim portion faces the elastic arm, and an orthographic projection of the elastic arm on the auxiliary diaphragm in a vibration direction of the diaphragm falls within a boundary of the rim portion.

8. The sounding device according to claim 7, wherein the second fixing wall extends into at least one of the plurality of avoidance notches, and at least one of the plurality of extending portions is connected to the second fixing wall.

9. The sounding device according to claim 7, wherein the elastic member is a flexible circuit board which is electrically connected to the voice coil.

10. The sounding device according to claim 7, wherein the magnetic circuit system further comprises a fixing plate, the elastic member is sandwiched between the auxiliary diaphragm and the fixing plate.

11. The sounding device according to claim 10, wherein the fixing plate comprises a fixing ring fixed to the frame, a first auxiliary pole core fixed to the fixing ring and stacked on the second auxiliary magnets, and a second auxiliary pole core fixed to the fixing ring through a connecting portion and stacked on the first auxiliary magnets.

12. The sounding device according to claim 11, wherein the first fixing wall is fixed to the fixing ring, and a space for receiving the elastic arm is formed between the fixing ring, the first auxiliary pole core, and the second auxiliary pole core.

* * * * *